(12) United States Patent
Tai et al.

(10) Patent No.: US 11,398,502 B2
(45) Date of Patent: Jul. 26, 2022

(54) DISPLAY DEVICE WITH IMPROVED IMAGE QUALITY DEGRADATION

(71) Applicant: Innolux Corporation, Miao-Li County (TW)

(72) Inventors: Ming-Jou Tai, Miao-Li County (TW); Chia-Hao Tsai, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 17/072,047

(22) Filed: Oct. 16, 2020

(65) Prior Publication Data
US 2021/0134846 A1 May 6, 2021

Related U.S. Application Data

(60) Provisional application No. 62/929,109, filed on Nov. 1, 2019.

(30) Foreign Application Priority Data

Aug. 5, 2020 (CN) .......................... 202010777448.X

(51) Int. Cl.
*H01L 23/552* (2006.01)
*H01L 27/12* (2006.01)

(52) U.S. Cl.
CPC ........ *H01L 27/1222* (2013.01); *H01L 23/552* (2013.01); *H01L 27/1248* (2013.01)

(58) Field of Classification Search
CPC .............. H01L 27/1222; H01L 23/552; H01L 27/1248

USPC ..... 257/72; 438/48, 128, 149, 151, 157, 283
See application file for complete search history.

(56) References Cited

U.S. PATENT DOCUMENTS

| 6,297,862 B1 | 10/2001 | Murade |
| 6,521,913 B1 | 2/2003 | Murade |
| 2015/0205176 A1* | 7/2015 | Lu ..................... G02F 1/136209 349/44 |

FOREIGN PATENT DOCUMENTS

| CN | 104793414 | 7/2015 |
| CN | 106249495 | 12/2016 |

OTHER PUBLICATIONS

Office Action of China Counterpart Application, dated Apr. 1, 2022, pp. 1-7.

* cited by examiner

*Primary Examiner* — Didarul A Mazumder
(74) *Attorney, Agent, or Firm* — JCIPRNET

(57) ABSTRACT

The disclosure provides a display device, which includes a substrate, two adjacent pixels, and two adjacent light shielding layers. The two adjacent pixels are respectively disposed on the substrate and arranged along the first direction. The two adjacent light shielding layers are respectively disposed between the two adjacent pixels and the substrate. One of the two adjacent pixels includes a sub-pixel and a low-sensitivity sub-pixel. The two adjacent light shielding layers are spaced apart by the gap region disposed corresponding to the low-sensitivity sub-pixel. The display device of the disclosure can reduce the problem of image quality degradation caused by photo-leakage current.

20 Claims, 4 Drawing Sheets

DISPLAY DEVICE WITH IMPROVED IMAGE QUALITY DEGRADATION

CROSS-REFERENCE TO RELATED APPLICATION

This application claims the priority benefit of U.S. application Ser. No. 62/929,109, filed on Nov. 1, 2019, and China application serial no. 202010777448.X, filed on Aug. 5, 2020. The entirety of each of the above-mentioned patent applications is hereby incorporated by reference herein and made a part of this specification.

BACKGROUND

Field of the Disclosure

The disclosure relates to an electronic device, and more particularly, to a display device that can reduce the problem of image quality degradation caused by photo-leakage current.

Description of Related Art

Display panels have been commonly applied to electronic devices such as mobile phones, televisions, monitors, tablet computers, car displays, wearable devices, and desktop computers. With the vigorous development of electronic devices, the requirements for the display quality of electronic products are getting higher, and therefore the display panels are constantly improved to have higher resolution.

SUMMARY OF THE DISCLOSURE

The disclosure provides a display device that can reduce the problem of image quality degradation caused by photo-leakage current.

According to an embodiment of the disclosure, the display device includes a substrate, two adjacent pixels, and two adjacent light shielding layers. The two adjacent pixels are arranged on the substrate and arranged along a first direction. The two adjacent light shielding layers are respectively arranged between the two adjacent pixels and the substrate. One of the two adjacent pixels includes a sub-pixel and a low-sensitivity sub-pixel. The two adjacent light shielding layers are spaced apart by a gap region. The gap region is disposed corresponding to the low-sensitivity sub-pixel.

BRIEF DESCRIPTION OF THE DRAWINGS

The drawings are incorporated to facilitate understanding of the disclosure, and the drawings are incorporated in and constitute a part of this specification. The drawings illustrate the embodiments of the disclosure, and together with the description serve to explain the principles of the disclosure.

DESCRIPTION OF EMBODIMENTS

Figure 1A:
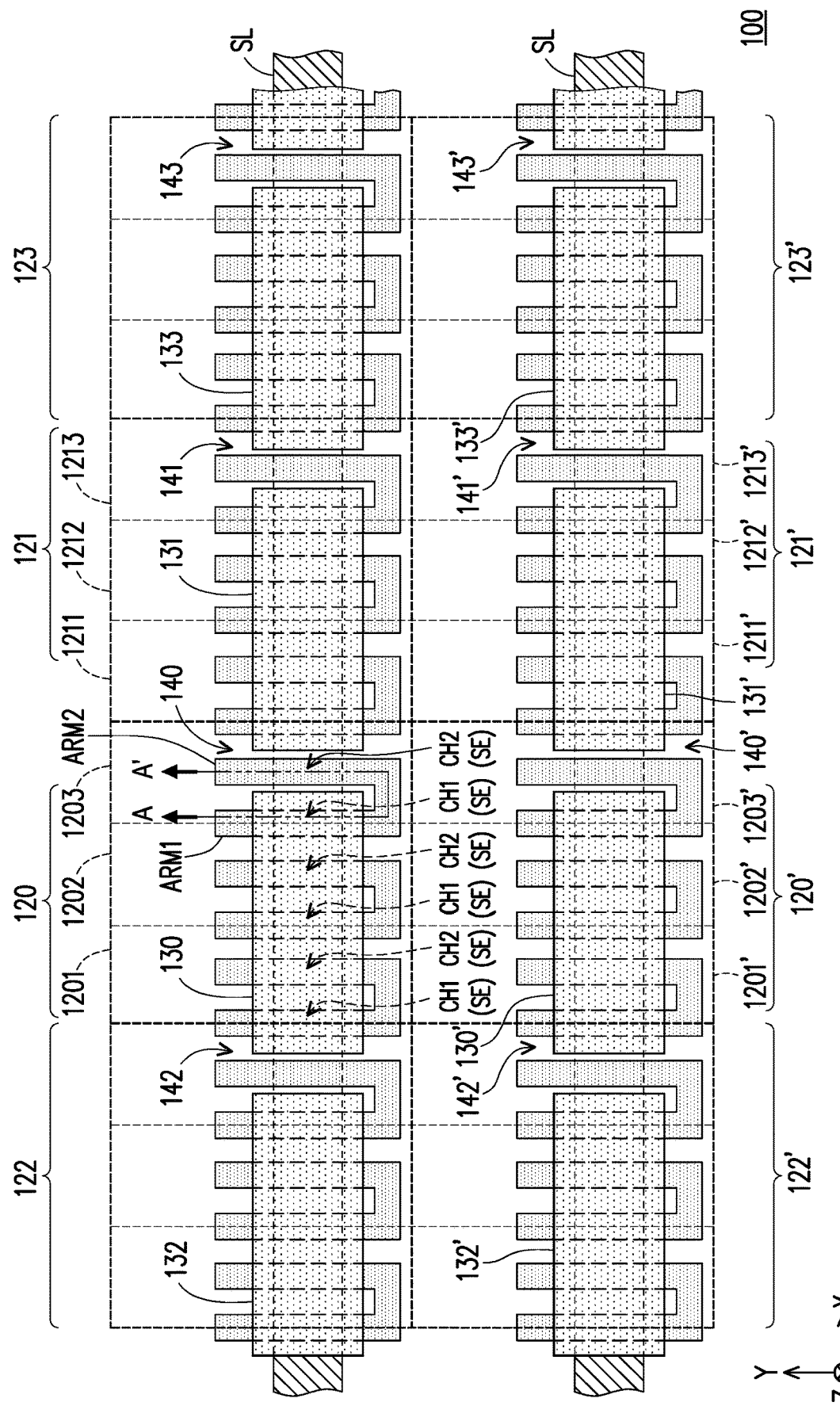
FIG. 1A is a schematic bottom view of a display device according to an embodiment of the disclosure.

This disclosure can be understood by referring to the following detailed description in conjunction with the accompanying drawings. It should be noted that in order to make the disclosure more comprehensible and for the simplicity of the drawings, the multiple drawings in this disclosure only depict a part of the electronic device. Moreover, the specific elements in the drawings are not drawn according to actual proportion. In addition, the number and size of each element in the figure are only for illustration, and are not used to limit the scope of the disclosure.

In the following description and claims, words such as "comprising" and "including" are open-ended words, so they should be interpreted as meaning "including but not limited to . . . ".

It should be understood that when an element or layer is referred to as being "on" or "connected" to another element or layer, it can be directly on or directly connected to this other element or layer, or there is an intervening element or layer between the two (indirect case). Conversely, when an element is said to be "directly" on or "directly connected" to another element or layer, there is no intervening element or layer between the two.

Although the terms first, second, third . . . can be used to describe various constituent elements, the constituent elements are not limited to these terms. These terms are only used to distinguish a single constituent element from other constituent elements in the specification. The same terms may not be used in the claims, and the element in claims may be replaced with first, second, third . . . according to the order specified in the claims. Therefore, in the following description, the first constituent element may be the second constituent element in the claims.

In some embodiments of the disclosure, with regard to terms such as "connection", "interconnection" and so on that describe bonding and connection, unless specifically defined, they can mean that two structures are in direct contact, or that two structures are not in direct contact, and there are other structures located between these two structures. Moreover, terms describing joining and connecting can also refer to the case where both structures are movable or both structures are fixed. In addition, the term "coupled" refers to any direct and indirect electrical connection means.

In this disclosure, the length and width can be measured by using an optical microscope, and the thickness can be measured through a cross-sectional image in an electron microscope, but the disclosure is not limited thereto. In addition, there may be a certain error in any two values or directions used for comparison.

It should be understood that the following embodiments can be substituted, recombined, and combined to complete other embodiments without departing from the spirit of the disclosure. The features among the embodiments can be mixed and matched freely as long as they do not violate the spirit of the disclosure or in conflict with each other.

The electronic device of the disclosure may include a display device, an antenna device, a sensing device, a touch display, a curved display or a free shape display, but the disclosure is not limited thereto. The electronic device can be a bendable or flexible electronic device. The display device may include, for example, a light-emitting diode (LED), liquid crystal, fluorescence, phosphor, other suitable display media, or a combination of the foregoing, but the disclosure is not limited thereto. Light-emitting diodes may include, for example, organic light-emitting diodes (OLED), inorganic light-emitting diodes, mini LED, micro LED or quantum dot (QD) light-emitting diodes (QLED, QDLED), or other suitable materials or any combination of the above, but the disclosure is not limited thereto. The display device may also include, for example, a tiled display device, but not limited thereto. The antenna device may be, for example, a liquid crystal antenna, but is not limited thereto. The antenna device may include, for example, a tiled antenna device, but is not limited thereto. It should be noted that the electronic device can be any combination of the foregoing, but not limited thereto. In addition, the appearance of the electronic device may be rectangular, circular, polygonal, a shape with curved edges, or other suitable shapes. The electronic device may have peripheral systems such as a driving system, a control system, a light source system, a shelf system, etc., to support a display device, an antenna device, or a tiled device. Hereinafter, the content of the disclosure will be narrated by taking a display device as an example, but the disclosure is not limited thereto.

Reference will now be made in detail to the exemplary embodiments of the disclosure, and the exemplary embodiments are illustrated in the accompanying drawings. Whenever possible, the same reference numerals are used in the drawings and descriptions to indicate the same or similar parts.

Figure 1B:
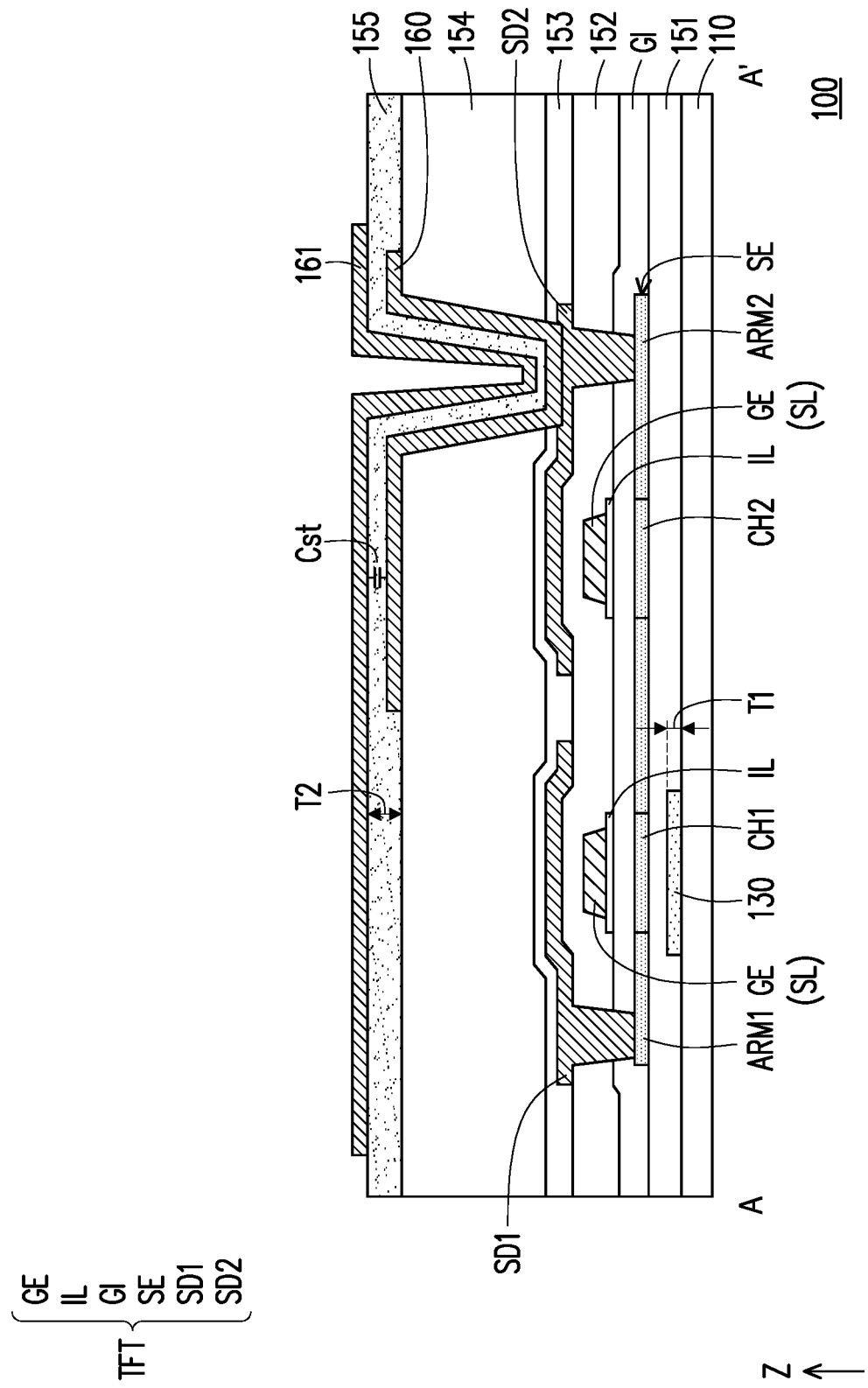
FIG. 1B is a schematic cross-sectional view of the display device of FIG. 1A taken along the section line A-A'.

FIG. 1A is a schematic bottom view of a display device according to an embodiment of the disclosure. FIG. 1B is a schematic cross-sectional view of the display device of FIG. 1A taken along the section line A-A'. For clarity of the drawings and ease of description, FIG. 1A omits illustration of some elements from the display device, for example, the substrate 110 is omitted, but the disclosure is not limited thereto.

Refer to FIG. 1A and FIG. 1B, the display device 100 of this embodiment includes a substrate 110, two adjacent pixels 120 and 121, and two adjacent light shielding layers 130 and 131. The two adjacent pixels 120 and 121 are disposed on the substrate 110 and arranged along the first direction X. One pixel 120 among the two adjacent pixels 120 and 121 includes sub-pixels 1201 and 1202 and a low-sensitivity sub-pixel 1203. The other pixel 121 of the two adjacent pixels 120 and 121 also includes a sub-pixel 1211, a sub-pixel 1212, and a low-sensitivity sub-pixel 1213. In this embodiment, the substrate 110 may include a rigid substrate, a flexible substrate, or a combination of the foregoing. For example, the material of the substrate 110 may include glass, quartz, sapphire, ceramics, polycarbonate (PC), polyimide (PI), polyethylene terephthalate (PET), other suitable substrate materials, or a combination of the foregoing, but the disclosure is not limited thereto. In this embodiment, the first direction X, the second direction Y, and the third direction Z are different directions. For instance, the first direction X is, for example, the extension direction of the scan line SL, and the third direction Z may be, for example, a normal direction of the substrate 110. The second direction Y and the third direction Z are respectively perpendicular to the first direction X, and the second direction Y is perpendicular to the third direction Z, but the disclosure is not limited thereto.

In addition, in this embodiment, the display device 100 further includes a pixel 122, a pixel 123, a pixel 120', a pixel 121', a pixel 122', a pixel 123', a light shielding layer 132, a light shielding layer 133, a light shielding layer 130', a light shielding layer 131', a light shielding layer 132', and a light shielding layer 133'. Specifically, the pixel 120' includes sub-pixels 1201', 1202', and a low-sensitivity sub-pixel 1203', and the pixel 121' may also include a sub-pixel 1211', a sub-pixel 1212', and a low-sensitivity sub-pixel 1213'.

Specifically, referring to FIG. 1A, in the bottom view of the display device 100 of this embodiment, the pixel 122, the pixel 120, the pixel 121, and the pixel 123 are sequentially arranged along the first direction X, and the pixel 122', the pixel 120', the pixel 121', and the pixel 123' are also arranged along the first direction X in sequence. Specifically, in the first direction X, the pixel 122 is adjacent to the pixel 120, the pixel 120 is adjacent to the pixel 121, the pixel 121 is adjacent to the pixel 123, the pixel 122' is adjacent to the pixel 120', the pixel 120' is adjacent to the pixel 121', and the pixel 121' is adjacent to the pixel 123'. In addition, in the second direction Y, the pixel 122 is arranged corresponding to and adjacent to the pixel 122', the pixel 120 is arranged corresponding to and adjacent to the pixel 120', the pixel 121 is arranged corresponding to and adjacent to the pixel 121', and the pixel 123 is arranged corresponding to and adjacent to the pixel 123'.

Please refer to FIG. 1A and FIG. 1B both. In this embodiment, the two adjacent light shielding layers 130 and 131 are respectively disposed between the two adjacent pixels 120 and 121 and the substrate 110. The light shielding layers 132, 133, 132', 130', 131' and 133' are also respectively disposed between the corresponding pixels 122, 123, 122', 120', 121' and 123' and the substrate 110. Specifically, the light shielding layer 132, the light shielding layer 130, the light shielding layer 131, and the light shielding layer 133 are sequentially arranged along the first direction X, and the light shielding layer 132', the light shielding layer 130', the light shielding layer 131' and the light shielding layer 133' are also sequentially arranged along the first direction X. In the first direction X, the light shielding layer 132 is adjacent to the light shielding layer 130, the light shielding layer 130 is adjacent to the light shielding layer 131, the light shielding layer 131 is adjacent to the light shielding layer 133, the light shielding layer 132' is adjacent to the light shielding layer 130', the light shielding layer 130' is adjacent to the light shielding layer 131', and the light shielding layer 131' is adjacent to the light shielding layer 133'. In this embodiment, the material of the light shielding layers 130, 131, 132, 133, 132', 130', 131' and 133' may include a metal, such as molybdenum, titanium, aluminum, gold, silver, copper, oxides thereof, nitrides or alloy materials thereof, or a combination thereof, but the disclosure is not limited thereto.

In this embodiment, one light shielding layer 130 of the two adjacent light shielding layers 130 and 131 is disposed corresponding to at least the sub-pixel 1201 and the sub-pixel 1202, and the other light shielding layer 131 of the two adjacent light shielding layers 130 and 131 is disposed corresponding to at least the sub-pixel 1211 and the sub-pixel 1212. That is, in this embodiment, one light shielding layer 130 of the two adjacent light shielding layer 130 and 131 may overlap the sub-pixel 1201 and the sub-pixel 1202 along the third direction Z, and the other light shielding layer 131 of the two adjacent light shielding layers 130 and 131 may overlap the sub-pixel 1211 and the sub-pixel 1212 along the third direction Z. It should be noted that the disclosure provides no limitation to the number of sub-pixels overlapped by a light shielding layer.

In detail, in this embodiment, the display device 100 further includes gap regions 140, 141, 142, 143, 140', 141', 142' and 143'. Specifically, the two adjacent light shielding layers 132 and 130 can be spaced apart by the gap region 142, the two adjacent light shielding layers 130 and 131 can be spaced apart by the gap region 140, and the two adjacent light shielding layers 131 and 133 can be spaced apart by the gap region 141. The light shielding layer 133 and another adjacent light shielding layer (not numbered) can be spaced apart by the gap region 143, the two adjacent light shielding layers 132' and 130' can be spaced apart by the gap region 142', the two adjacent light shielding layers 130' and 131' can be spaced apart by the gap region 140', the two adjacent light shielding layers 131' and 133' can be spaced apart by the gap region 141', and the light shielding layer 133' and another adjacent light shielding layer (not numbered) can be spaced apart by the gap region 143'. Therefore, in this embodiment, each pixel 120, 121, 122, 123, 120', 121', 122' and 123' respectively has a corresponding light shielding layer 130, 131, 132, 133, 130', 131', 132' and 133' and a corresponding gap region 140, 141, 142, 143, 140', 141', 142' and 143'.

To be more specific, in this embodiment, the gap region 140 may be configured corresponding to the low-sensitivity sub-pixel 1203, the gap region 141 may be configured corresponding to the low-sensitivity sub-pixel 1213, the gap region 140' may be configured corresponding to the low-sensitivity sub-pixel 1203', and the gap region 141' may be configured corresponding to the low-sensitivity sub-pixel 1213'. That is, in the third direction Z, the low-sensitivity sub-pixel 1203 overlaps the gap region 140, the low-sensitivity sub-pixel 1213 overlaps the gap region 141, the low-sensitivity sub-pixel 1203' overlaps the gap region 140', and the low-sensitivity sub-pixel 1213' overlaps the gap region 141'. In addition, in this embodiment, in the second direction Y, the gap region 142 can correspond to the gap region 142', the gap region 140 can correspond to the gap region 140', the gap region 141 can correspond to the gap region 141', and the gap region 143 can correspond to the gap region 143', but the disclosure is not limited thereto.

Please continue to refer to FIG. 1A and FIG. 1B both. In this embodiment, the low-sensitivity sub-pixel 1203 may include a thin-film transistor driving unit TFT. The thin-film transistor driving unit TFT is disposed on the substrate 110, and the thin-film transistor driving unit TFT includes a gate GE, an insulating layer IL, a part of the gate insulating layer GI, a U-shaped active region SE containing channel regions CH1 and CH2, a source SD1 and a drain SD2. In this embodiment, the material of the source SD1 and/or the drain SD2 may include transparent conductive materials or non-transparent conductive materials, such as indium tin oxide, indium zinc oxide, indium oxide, zinc oxide, tin oxide, and metal materials (such as aluminum, molybdenum, copper, silver, etc.), other suitable materials, or a combination of the above, but the disclosure is not limited thereto. In this embodiment, the material of the U-shaped active region SE may include amorphous silicon, low-temperature polysilicon (LTPS), metal oxide (such as indium gallium zinc oxide IGZO), other suitable materials, or a combination of the above, but the disclosure is not limited thereto. In other embodiments, different thin-film transistor driving units TFT may include different materials of the U-shaped active region SE, but the disclosure is not limited thereto. In this embodiment, the gate GE of the thin-film transistor driving unit TFT may be a top gate structure, but the disclosure is not limited thereto. In some embodiments, the gate GE may be a bottom gate, a dual gate, or a double gate structure.

In this embodiment, the scan line SL and the data line (not shown) are disposed on the substrate 110, and the scan line SL and the data line intersect each other. Specifically, the first direction X can be regarded as the extension direction of the scan line SL, and the second direction Y can be regarded as the extension direction of the data line, but the disclosure is not limited thereto. In this embodiment, the scan line SL can be electrically connected to the gate GE of the thin-film transistor driving unit TFT, and the data line can be electrically connected to the source SD1 of the thin-film transistor driving unit TFT, and the thin-film transistor driving unit TFT can be electrically connected to the scan line SL and the data line respectively through the gate GE and the source SD1. In some embodiments, the material of the scan line SL and the data line may include molybdenum (Mo), titanium (Ti), tantalum (Ta), niobium (Nb), hafnium (Hf), Nickel (Ni), chromium (Cr), cobalt (Co), zirconium (Zr), tungsten (W), aluminum (Al), copper (Cu), argentum (Ag), other suitable metals, or alloys or combinations of the above materials, but the disclosure is not limited thereto.

In this embodiment, as shown in FIG. 1A, in the third direction Z, the gap region 140 may overlap the U-shaped active region SE of the thin-film transistor driving unit TFT in the low-sensitivity sub-pixel 1203. Specifically, the gap region 140 may overlap one arm portion ARM2 of the U-shaped active region SE in the low-sensitivity sub-pixel 1203, and does not overlap the other arm portion ARM1 of the U-shaped active region SE in the low-sensitivity sub-pixel 1203. In addition, in FIG. 1A, the sub-pixel regions of sub-pixels such as sub-pixels 1201 to 1203 include all of one arm portion ARM2 and a part of the other arm portion ARM1 of the U-shaped active region SE, but the disclosure is not limited thereto. The range of the active region included in a sub-pixel can vary according to the actual product design.

In addition, in this embodiment, as shown in FIG. 1B, the light shielding layer 130 is disposed between the channel region CH1 of the U-shaped active region SE and the substrate 110, thereby preventing the light below the substrate 110 from directly irradiating the channel region CH1 in the U-shaped active region SE and causing photo-leakage current. The light shielding layer 130 is provided corresponding to the channel region CH1. Specifically, as shown in FIG. 1A and FIG. 1B, in the third direction Z, the light shielding layer 130 overlaps the channel region CH1 of one arm portion ARM1 of the U-shaped active region SE in the low-sensitivity sub-pixel 1203, and does not overlap the channel region CH2 of the other arm portion ARM2 of the U-shaped active region SE in the low-sensitivity sub-pixel 1203, but the disclosure is not limited thereto. In addition, in this embodiment, as shown in FIG. 1A, in the third direction Z, the light shielding layer 130 can overlap the two channel regions CH1 and CH2 of the U-shaped active region SE in the sub-pixel 1201, and can overlap the two channel regions CH1 and CH2 of the U-shaped active region SE in the sub-pixel 1202, thereby reducing the photo-leakage current in the sub-pixels 1201 and 1202.

In this embodiment, the thickness T1 of the light shielding layer 130 can be 500 angstroms to 3000 angstroms (500 angstroms≤T1≤3000 angstroms), and the light transmittance of the light shielding layer 130 can be less than 5% or less than 0.1%. Accordingly, the image quality degradation caused by photo-leakage current can be reduced. Therefore, when the thickness of the light shielding layer 130 is less than 500 angstroms, the light transmittance of the light shielding layer 130 is greater than 5%, and photo-leakage current occurs, which causes image quality degradation. When the thickness of the light shielding layer 130 is greater than 3000 angstroms, although the light transmittance of the light shielding layer 130 may be less than 0.1%, it is likely that the light shielding layer 130 is too thick and consequently the U-shaped active region SE or the insulating layer 151 is not easily formed on the light shielding layer 130. As a result, the U-shaped active region SE is disconnected, which causes an open circuit; or the U-shaped active region SE is in contact with the light shielding layer 130 and short circuit occurs as a result. In this embodiment, the thickness T1 is, for example, the maximum thickness of the light shielding layer 130 measured along the third direction Z. The light transmittance is defined as the ratio of the light intensity of light on a light-emitting surface to the light intensity of light on a light-receiving surface after the light passes through the layer when the layer is irradiated by the light.

Refer to FIG. 1B, in this embodiment, the display device 100 further includes an insulating layer 151, an insulating layer 152, an insulating layer 153, an insulating layer 154, an insulating layer 155, a pixel electrode 160, and a common electrode 161. The insulating layer 151 is disposed between the thin-film transistor driving unit TFT and the substrate 110, and covers the light shielding layer 130 and the substrate 110. The insulating layer 152 is disposed between the source SD1 (or drain SD2) and the gate insulating layer GI, and covers the gate GE, the insulating layer IL, and the gate insulating layer GI. The insulating layer 153 is disposed on the substrate 110 and covers the source SD1, the drain SD2 and the insulating layer 152. The insulating layer 153 and the insulating layer 151 are respectively disposed on opposite sides of the thin-film transistor driving unit TFT. The insulating layer 154 is disposed on the insulating layer 153, and the insulating layer 154 and the insulating layer 152 are respectively located on opposite sides of the insulating layer 153. The pixel electrode 160 is disposed on the insulating layer 154 and is electrically connected to the drain SD2. The insulating layer 155 is disposed on the pixel electrode 160 and covers the pixel electrode 160 and the insulating layer 154. The common electrode 161 is disposed on the insulating layer 155, and the common electrode 161 and the pixel electrode 160 are located on opposite sides of the insulating layer 155 respectively. In some embodiments, the insulating layer 151, the gate insulating layer GI, the insulating layer IL, the insulating layer 152, the insulating layer 153, the insulating layer 154, and the insulating layer 155 may be a single-layer or multi-layer structure, and may, for example, include organic materials (such as silicon nitride, etc.), inorganic materials or a combination of the foregoing, but the disclosure is not limited thereto. In some embodiments, the material of the pixel electrode 160 and the common electrode 161 may include a transparent conductive material, but the disclosure is not limited thereto. It should be noted that the structure shown in FIG. 1B is only an example, and the structure of the display device in the disclosure is not limited thereto.

In this embodiment, the thickness T2 of the insulating layer 155 can be in a range from 300 angstroms to 2000 angstroms (300 angstroms≤T2≤2000 angstroms), and the storage capacitor Cst between the common electrode 161 and the pixel electrode 160 can stabilize the pixel voltage. When the thickness of the insulating layer 155 is greater than 2000 angstroms, the storage capacitor Cst is too small to stabilize the pixel voltage. When the thickness of the insulating layer 155 is less than 300 angstroms, the common electrode 161 may be in contact with the pixel electrode 160 due to the insulating layer 155 being too thin, and thus causing a short circuit. In this embodiment, the thickness T2 may be, for example, the maximum thickness of the insulating layer 155 measured along the third direction Z.

In this embodiment, the low-sensitivity sub-pixel 1203 may be a blue sub-pixel, the sub-pixel 1201 may be a red sub-pixel, and the sub-pixel 1202 may be a green sub-pixel, but the disclosure is not limited thereto. In some embodiments, the low-sensitivity sub-pixel 1203 may also be a red sub-pixel, the sub-pixel 1201 may be a green sub-pixel, and the sub-pixel 1202 may be a blue sub-pixel. In some embodiments, the low-sensitivity sub-pixels may also be blue sub-pixels and red sub-pixels, and the sub-pixels may be green sub-pixels. In other words, it will suffice as long as the low-sensitivity sub-pixel 1203 is not a green sub-pixel.

In detail, in this embodiment, the red sub-pixel can emit red light, the green sub-pixel can emit green light, and the blue sub-pixel can emit blue light. Specifically, the sensitivities of the human eye to red light, green light and blue light are not the same. For example, if the sensitivities of the human eye to different colors are quantified, the sensitivity of the human eye to red light can be about 17. The sensitivity of the human eye to green light may be about 50, and the sensitivity of the human eye to blue light may be about 8. In other words, the human eye is more sensitive to green light than to blue and red light. That is, compared to the brightness difference of blue light and the brightness difference of red light, the human eye is more sensitive to the brightness difference of green light.

For example, in an embodiment, the ideal brightness when there is no photo-leakage current is used as a reference, when light is irradiated, each sub-pixel in a pixel will generate photo-leakage current, and the brightness of each sub-pixel in the pixel varies due to photo-leakage current. Specifically, due to the light shielding layer 130, it can be assumed that the sub-pixels 1201 and 1202 make the sub-pixel brightness difference caused by photo-leakage current to be 1.5%, and it can be assumed that the sub-pixel brightness difference caused by photo-leakage current due to the gap region 140 increases to 3%. In the above hypothetical cases, when the sub-pixel 1201 is a red sub-pixel, the sub-pixel 1202 is a green sub-pixel, and the sub-pixel 1203 corresponding to the gap region 140 is a blue sub-pixel, the overall brightness difference of the pixel 120 that can be perceived by the human eye is [(1.5%*17)+(1.5%*50)+(3%*8)]/(17+50+8)=1.67%. However, when the sub-pixel 1201 is a red sub-pixel, the sub-pixel 1202 is a blue sub-pixel, and the sub-pixel corresponding to the gap region 140 is a green sub-pixel, the overall brightness difference of the pixel 120 that human eye can perceive will increase to [(1.5%*17)+(1.5%*8)+(3%*50)]/(17+50+8)=2.5%. Therefore, in this embodiment, in order to effectively reduce the human eye's perception of the overall brightness difference of the pixels, the two channel regions corresponding to the green sub-pixels with the highest sensitivity should be covered by the light shielding layer, and the gap region is arranged in the blue sub-pixel with lower sensitivity or the red sub-pixel with the second highest sensitivity. For example, in this embodiment, the light shielding layer can be used to cover the two channel regions corresponding to the green sub-pixels with the highest sensitivity, the two channel regions corresponding to the red sub-pixels with the second highest sensitivity, and a channel region corresponding to the blue sub-pixel with lower sensitivity (i.e., expose another channel region corresponding to the blue sub-pixel), and the image quality degradation caused by photo-leakage current can be reduced. More specifically, when the sub-pixels with larger brightness differences are sub-pixels with lower sensitivity to human eye (such as blue sub-pixels), the human eye is less likely to perceive the brightness differences of individual pixels caused by photo-leakage current, and thus it is not easy to notice the problem that the image quality of the entire screen is degraded caused by photo-leakage current.

It should be noted that although this embodiment takes red, blue, and green light as an example, the disclosure is not limited thereto. Considering that the human eye has different sensitivity to lights with different wavelengths, in this disclosure, a maximum sensitivity of the human eye to a specific wavelength in the visible light spectrum will be used as the reference. When the sensitivity of the human eye to a color light emitted by a sub-pixel is lower than 50% of the maximum sensitivity (0≤sensitivity/maximum sensitivity<50%), the sub-pixel can be called a low-sensitivity sub-pixel.

Figure 2:
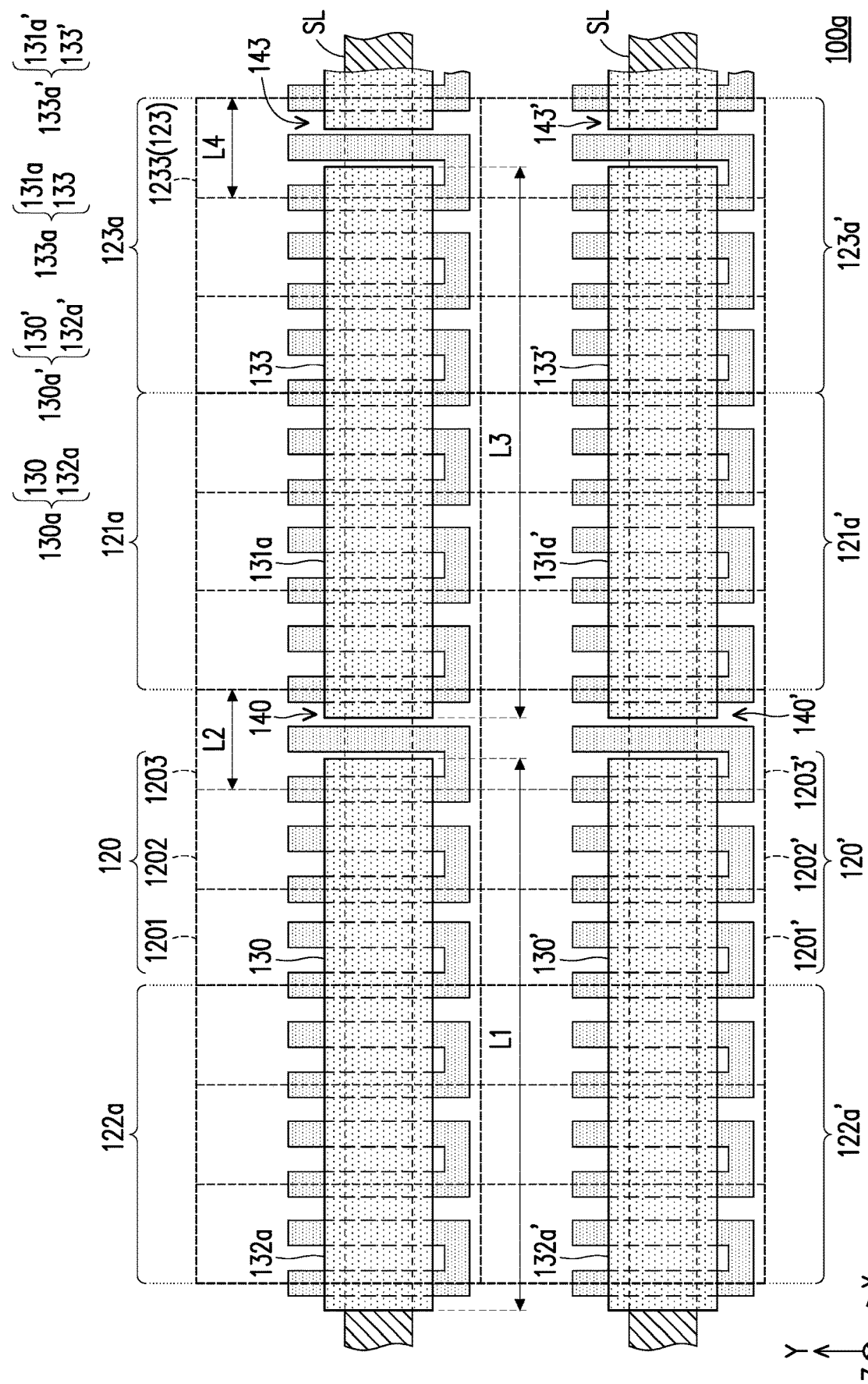
FIG. 2 is a schematic bottom view of a display device according to another embodiment of the disclosure.
Figure 3:
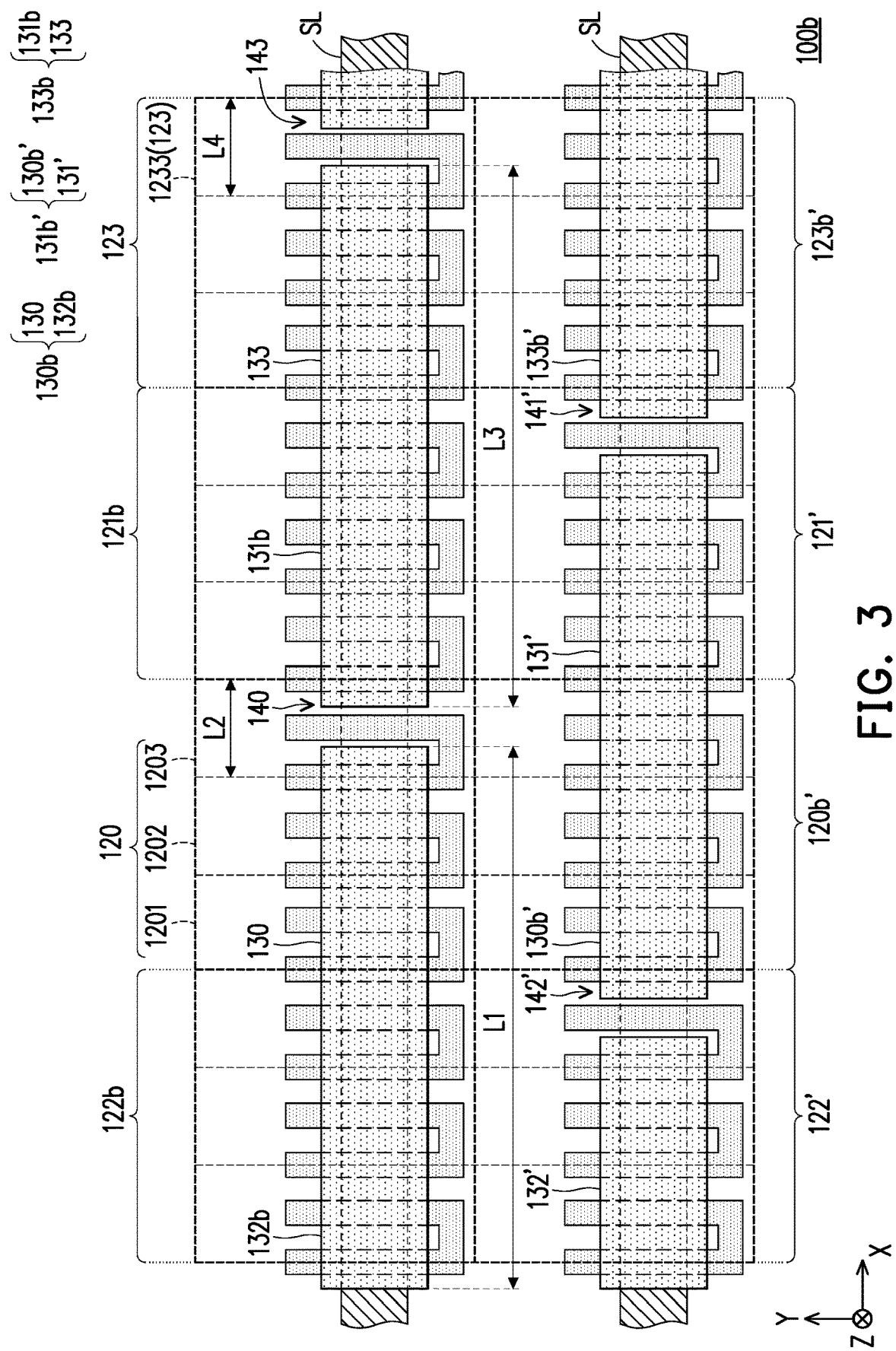
FIG. 3 is a schematic bottom view of a display device according to another embodiment of the disclosure.

In this embodiment, the configuration of the gap regions 140, 141, 142, 143, 140', 141', 142' and 143' can reduce the mutual interference of signals caused by the connection of the light shielding layers 130, 131, 132, 133, 130', 131', 132' and 133', and can reduce the change of threshold voltage (Vth) of the thin-film transistor driving unit TFT. In addition, although each pixel 120, 121, 122, 123, 120', 121', 122' and 123' in this embodiment has a corresponding gap region 140, 141, 142, 143, 140', 141', 142' and 143', the disclosure provides no limitation to the corresponding relationship between the number of pixels and the gap regions. In other words, in some embodiments, there may be one corresponding gap region for every two pixels, that is, not every low-sensitivity sub-pixel is provided with a corresponding gap region, as shown in FIG. 2 and FIG. 3. In some embodiments, there may be one corresponding gap region for every N pixels, wherein N is greater than or equal to 1.

In short, in the display device 100 of this embodiment, two adjacent light shielding layers 130 and 131 are respectively disposed on two adjacent pixels 120 and 121, and the gap region 140 is disposed corresponding to the low-sensitivity sub-pixel 1203, such arrangement enables the display device 100 of this embodiment to reduce the image quality degradation caused by photo-leakage current. In addition, by arranging the gap region 140 between two adjacent light shielding layers 130 and 131, the display device of this embodiment can reduce the mutual interference of signals caused by the connection of two adjacent light shielding layers (such as mutual interference between the light shielding layer 130 and the gate GE, or mutual interference between the light shielding layer 130 and the source SD1, but the disclosure is not limited thereto).

Other embodiments will be listed below for description. It should be noted here that the following embodiments use the reference numbers and part of the content of the foregoing embodiments, wherein the same reference numbers are used to represent the same or similar elements, and the description for the same technical content is omitted. For the description of omitted parts, please refer to the foregoing embodiments, and the same content will not be repeated in the following embodiments.

FIG. 2 is a schematic bottom view of a display device according to another embodiment of the disclosure. Please refer to FIG. 1A and FIG. 2 both. The display device 100a of this embodiment is similar to the display device 100 of FIG. 1A. Therefore, the same components and similar components in the two embodiments are not repeated here. The display device 100a of this embodiment is different from the display device 100 mainly in that, in the display device 100a of this embodiment, the light shielding layer 132a and the light shielding layer 130 are connected to each other, the light shielding layer 131a and the light shielding layer 133 are connected to each other, the light shielding layer 132a' and the light shielding layer 130' are connected to each other, and the light shielding layer 131a' and the light shielding layer 133' are connected to each other.

Specifically, in this embodiment, the pixel 120, the pixel 123, the pixel 120', and the pixel 123' are respectively provided with a corresponding gap region 140, a gap region 143, a gap region 140', and a gap region 143', wherein the gap region 140 may correspond to the gap region 140' in the second direction Y, and the gap region 143 may correspond to the gap region 143' in the second direction Y. The pixel 122a, the pixel 121a, the pixel 122a' and the pixel 121a' are not provided with a corresponding gap region. Therefore, in this embodiment, the light shielding layer 132a and the light shielding layer 130 corresponding to the pixel 122a and the pixel 120 in adjacency are connected to each other to form the light shielding layer 130a, the light shielding layer 131a and the light shielding layer 133 corresponding to the pixel 121a and the pixel 123 in adjacency are connected to each other to form the light shielding layer 133a, the light shielding layer 132a' and the light shielding layer 130' corresponding to the pixel 122a' and the pixel 120' in adjacency are connected to each other to form the light shielding layer 130a', and the light shielding layer 131a' and the light shielding layer 133' corresponding to the pixel 121a' and the pixel 123' in adjacency are connected to each other to form the light shielding layer 133a'.

Therefore, in the display device 100a of this embodiment, there is one corresponding gap region for every two adjacent pixels. For example, the pixel 120 and the pixel 121a in adjacency together have one corresponding gap region 140, and the pixel 121a and the pixel 123 in adjacency together have one corresponding gap region 143. Similarly, the pixel 120' and the pixel 121a' in adjacency together have one corresponding gap region 140', and the pixel 121a' and the pixel 123' in adjacency together have one corresponding gap region 143'.

In addition, in this embodiment, the length L1 of one light shielding layer 130a of the two adjacent light shielding layers 130a and 133a along the first direction X may be greater than five times the length L2 of the low-sensitivity sub-pixel 1203 along the first direction X. The length L3 of another light shielding layer 133a of the two adjacent light shielding layers 130a and 133a along the first direction X may also be greater than five times the length L4 of the low-sensitivity sub-pixel 1233 along the first direction X, but the disclosure is not limited thereto. In addition, it should be noted that in the disclosure, the lengths L1 and L3 of the light shielding layer along the first direction X can be defined as the maximum distance in the first direction X between two end points (e.g., the leftmost end point and the rightmost end point of the light shielding layer 130a in FIG. 2) of a light shielding layer along the first direction X in a top view, and the lengths L2 and L4 of the low-sensitivity sub-pixel can be defined as the shortest distance from the left side of the data line on the left side of the sub-pixel to the left side of the data line on the right side of the sub-pixel along the first direction X. In addition, the number of pixels or sub-pixels overlapped by the sub-pixel light shielding layer is not limited to FIG. 2.

In addition, in this embodiment, although the gap region 140 can correspond to the gap region 140' in the second direction Y, and the gap region 143 can correspond to the gap region 143' in the second direction Y, the disclosure provides no limitation to the corresponding relationship between these gap regions. That is, in some embodiments, in the second direction Y, there may be no corresponding relationship between two gap regions. For example, in some embodiments, multiple gap regions may also be arranged in a staggered manner, as shown in FIG. 3.

FIG. 3 is a schematic bottom view of a display device according to another embodiment of the disclosure. Please refer to FIG. 1A and FIG. 3 both. The display device 100b of this embodiment is substantially similar to the display device 100 of FIG. 1A, so the same components and similar components in the two embodiments are not repeated here. The display device 100*b* of this embodiment is different from the display device 100 mainly in that, in the display device 100*b* of this embodiment, the light shielding layer 132*b* and the light shielding layer 130 are connected to each other, the light shielding layer 131*b* and the light shielding layer 133 are connected to each other, and the light shielding layer 130*b*' and the light shielding layer 131' are connected to each other.

Specifically, in this embodiment, the pixel 120, the pixel 123, the pixel 122', and the pixel 121' are respectively provided with a corresponding gap region 140, a gap region 143, a gap region 142', and a gap region 141'. The gap region 140 does not correspond to the gap region 142' in the second direction Y, but is staggered with the gap region 142'. The gap region 143 does not correspond to the gap region 141' in the second direction Y, but is staggered with the gap region 141'. In other words, the gap region 142', the gap region 140, the gap region 141', and the gap region 143 may be arranged in a staggered manner. In this embodiment, the pixel 122*b*, the pixel 121*b*, the pixel 120*b*' and the pixel 123*b*' are not provided with a gap region. Therefore, in this embodiment, the light shielding layer 132*b* and the light shielding layer 130 corresponding to the pixel 122*b* and the pixel 120 in adjacency are connected to each other to form the light shielding layer 130*b*, the light shielding layer 131*b* and the light shielding layer 133 corresponding to the pixel 121*b* and the pixel 123 in adjacency are connected to each other to form the light shielding layer 133*b*, and the light shielding layer 130*b*' and the light shielding layer 131' corresponding to the pixel 120*b*' and the pixel 121' in adjacency are connected to each other to form the light shielding layer 131*b*'.

Therefore, in the display device 100*b* of this embodiment, there is one corresponding gap region for every two adjacent pixels. For example, the pixel 120 and the pixel 121*b* in adjacency have one corresponding gap region 140, the pixel 121*b* and the pixel 123 in adjacency have one corresponding gap region 143, the pixel 122' and the pixel 120*b*' in adjacency have one corresponding gap region 142', and the pixel 121' and the pixel 123*b*' in adjacency have one corresponding gap region 141'.

In addition, in this embodiment, the length L1 of one light shielding layer 130*b* of the two adjacent light shielding layers 130*b* and 133*b* along the first direction X may be greater than five times the length L2 of the low-sensitivity sub-pixel 1203 along the first direction X. The length L3 of another light shielding layer 133*b* of the two adjacent light shielding layers 130*b* and 133*b* along the first direction X may be greater than five times the length L4 of the low-sensitivity sub-pixel 1233 along the first direction X, but the disclosure is not limited thereto. In the disclosure, the number of pixels or sub-pixels overlapped by the light shielding layer is not limited to FIG. 3. When the gap regions are arranged in a staggered arrangement as shown in FIG. 3, the positions of the sub-pixels with large brightness differences caused by photo-leakage current can be scattered, making it less likely for the user to notice the overall image quality degradation caused by photo-leakage current.

To sum up, in the display device of the embodiment of the disclosure, two adjacent light shielding layers are respectively disposed on two adjacent pixels, and the gap region is disposed corresponding to the low-sensitivity sub-pixels, and the display device of this embodiment can reduce the image quality degradation caused by photo-leakage current. In addition, by arranging the gap region between two adjacent light shielding layers, the display device of this embodiment can reduce the problem of mutual interference of signals caused by the connection of two adjacent light shielding layers (such as the mutual interference between the light shielding layer and the gate, or the mutual interference between the light shielding layer and the source, but the disclosure is not limited thereto).

Finally, it should be noted that the above embodiments are only used to illustrate the technical solutions of the disclosure, not to limit them. Although the disclosure has been described in detail with reference to the foregoing embodiments, those of ordinary skill in the art should understand that: the technical solutions described in the foregoing embodiments can still be combined or modified, or some or all of the technical features can be equivalently replaced; and these combinations, modifications, or replacements do not make the nature of the corresponding technical solutions deviate from the scope of the technical solutions in the embodiments of the disclosure.

What is claimed is:

1. A display device, comprising:
   a substrate;
   two adjacent pixels disposed on the substrate and arranged along a first direction; and
   two adjacent light shielding layers respectively disposed between the two adjacent pixels and the substrate;
   wherein one of the two adjacent pixels comprises a sub-pixel and a low-sensitivity sub-pixel, the two adjacent light shielding layers are spaced apart by a gap region, and the gap region is disposed corresponding to the low-sensitivity sub-pixel.

2. The display device of claim 1, wherein the low-sensitivity sub-pixel is a blue sub-pixel.

3. The display device of claim 1, wherein the low-sensitivity sub-pixel is a red sub-pixel.

4. The display device of claim 1, wherein the sub-pixel is a green sub-pixel.

5. The display device of claim 1, wherein the low-sensitivity sub-pixel comprises a thin-film transistor driving unit, and the gap region overlaps the thin-film transistor driving unit.

6. The display device of claim 5, wherein the thin-film transistor driving unit comprises a U-shaped active region, and the gap region overlaps an arm portion of the U-shaped active region, and does not overlap another arm portion of the U-shaped active region.

7. The display device of claim 6, wherein the arm portion comprises a channel region, the another arm portion comprises another channel region, and the gap region overlaps the channel region of the arm portion and does not overlap the another channel region of the another arm portion.

8. The display device of claim 1, wherein one of the two adjacent light shielding layers overlaps with the sub-pixel.

9. The display device of claim 1, wherein the low-sensitivity sub-pixel overlaps with the gap region.

10. The display device of claim 1, wherein a length of one of the two adjacent light shielding layers along the first direction is greater than five times a length of the low-sensitivity sub-pixel in the first direction.

11. The display device of claim 1, further comprising:
   another two adjacent pixels disposed on the substrate and arranged along the first direction; and
   another two adjacent light shielding layers respectively disposed between the another two adjacent pixels and the substrate, wherein the two adjacent pixels and the another two adjacent pixels are arranged along a second direction, the second direction is different from the first direction, the another two adjacent light shielding layers are spaced apart by another gap region, and the gap region is disposed corresponding to the another gap region in the second direction.

12. The display device of claim 1, further comprising:
another two adjacent pixels disposed on the substrate and arranged along the first direction; and
another two adjacent light shielding layers respectively disposed between the another two adjacent pixels and the substrate, wherein the two adjacent pixels and the another two adjacent pixels are arranged along a second direction, the second direction is different from the first direction, the another two adjacent light shielding layers are spaced apart by another gap region, and the gap region is staggered with the another gap region in the second direction.

13. The display device of claim 1, wherein the two adjacent light shielding layers have a thickness of 500 angstroms to 3000 angstroms.

14. The display device of claim 1, wherein a material of the two adjacent light shielding layers comprises a metal.

15. The display device of claim 14 wherein a material of the two adjacent light shielding layers comprises molybdenum, titanium, aluminum, gold, silver, copper, or a combination thereof.

16. The display device of claim 1, wherein the sub-pixel comprises a thin-film transistor driving unit, and one of the two adjacent light shielding layers overlaps the thin-film transistor driving unit.

17. The display device of claim 1, further comprising:
a pixel electrode disposed on the substrate;
a common electrode disposed on the pixel electrode; and
an insulating layer disposed between the pixel electrode and the common electrode, wherein the insulating layer has a thickness of 300 angstroms to 2000 angstroms.

18. The display device of claim 17, wherein at least one of the pixel electrode and the common electrode comprises a transparent conductive material.

19. The display device of claim 1, wherein one of the two adjacent light shielding layers is disposed corresponding to one of the two adjacent pixels, and the other one of the two adjacent light shielding layers is disposed corresponding to the other one of the two adjacent pixels.

20. The display device of claim 1, further comprising:
another two adjacent pixels disposed on the substrate and arranged adjacent to the two adjacent pixels along the first direction;
wherein one of the two adjacent light shielding layers is disposed corresponding to the two adjacent pixels, and the other one of the two adjacent light shielding layers is disposed corresponding to the another two adjacent pixels.

* * * * *